United States Patent [19]

Huguenin et al.

[11] 4,068,171
[45] Jan. 10, 1978

[54] FREQUENCY COMPARATOR

[75] Inventors: Raymond Huguenin, Port; Hubert Matthey, Brugg; Jean Engdahl, Bienne, all of Switzerland

[73] Assignee: Societe Suisse pour l'Industrie Horlogere Management Services S.A., Bienne, Switzerland

[21] Appl. No.: 721,723

[22] Filed: Sept. 9, 1976

[30] Foreign Application Priority Data

Sept. 12, 1975 Switzerland .................. 11890/75

[51] Int. Cl.$^2$ ........................................... G01R 23/14
[52] U.S. Cl. ............................. 324/79 R; 324/83 D
[58] Field of Search ............ 324/83 R, 83 D, 82, 324/79 R; 328/133

[56] References Cited

U.S. PATENT DOCUMENTS

| 3,671,876 | 6/1972 | Oshiro | 324/83 D |
| 3,754,241 | 8/1973 | Maehara | 324/83 D |

Primary Examiner—M. Tokar
Attorney, Agent, or Firm—Griffin, Branigan and Butler

[57] ABSTRACT

Two frequencies to be compared are applied to two inputs of a flip-flop. The output of the flip-flop is fed to a low pass filter and the output of the filter is a saw tooth voltage proportional to the phase difference between the two frequencies. Differentiation of the saw tooth voltage yields a voltage proportional to the difference between the two frequencies. A threshold circuit is provided for sensing the output voltage of the filter to control a flip-flop which in turn reverses the phase of one of the frequency signals and disconnects the output of the differentiator from a capacitive storage circuit.

2 Claims, 9 Drawing Figures

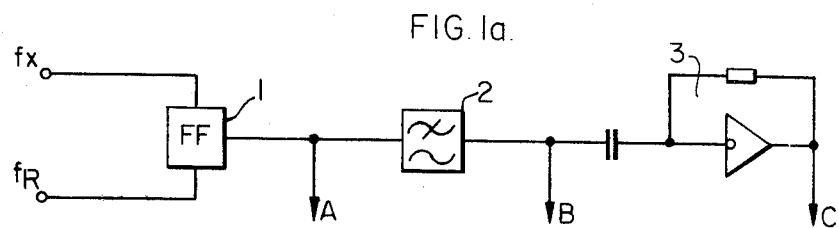
FIG. 1a.
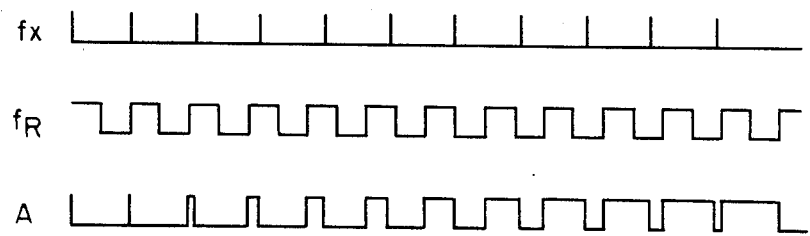
FIG. 1b
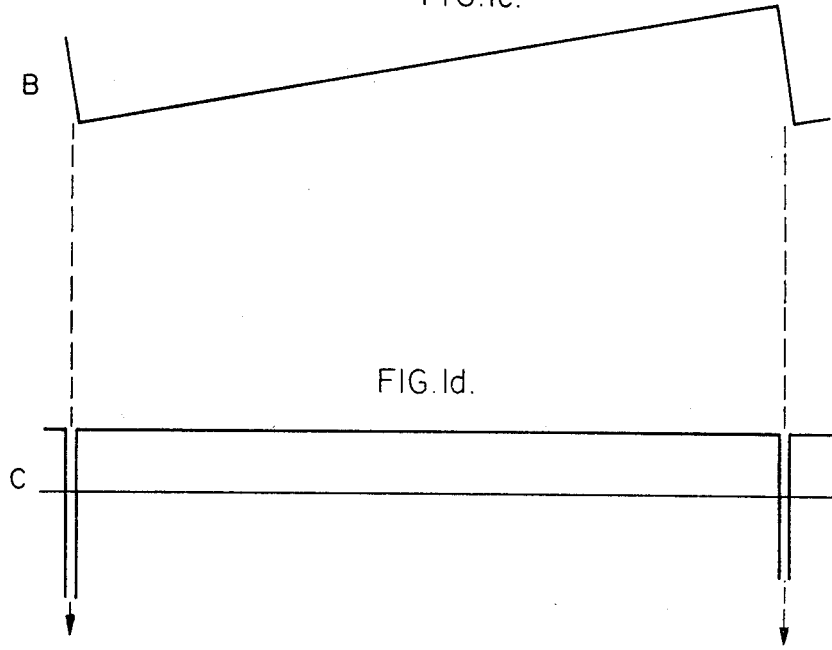
FIG. 1c.
FIG. 1d.

FREQUENCY COMPARATOR

In metrology there are numerous cases in which one wishes to observe rapidly, small variations of the frequency about a chosen value designated as limit. There may be mentioned for example the surveillance of the frequency changes of oscillators subjected to various disturbances as for example termperature fluctuations, as well as, and in particular the adjustment of the frequency of quartz resonators.

Standard equipment for counting, i.e. frequency meters or wave length meters, is in principle usable as well as arrangements which make use of the beat frequency phenomenon.

These systems have in common that the unknown frequency $f_x$ or the reference frequency $f_R$, the acquisition time T and the resolution r are connected by a relationship of the form:

$$f(x,R) \geq 1/r \cdot T$$

The frequency for which the lower limit becomes important is according to the system either the frequency to be measured $f_x$ or the reference frequency $f_R$:

| system | f (x,R) | to be read |
|---|---|---|
| frequency meter | $f_x$ | $f_x$ |
| wave length meter | $f_R$ | $\frac{1}{f_x}$ |
| beat | $f_x = f_R$ | $\|f_x - f_R\|$ |

The data to be read is shown in a digital form, but may be placed in an analog form by means of an appropriate converter.

The beat system for which $f_R$ assumes the limit value gives directly the difference relative to that limit value, not taking into account the sign.

For systems of measurement by counting, the product of the resolution and of the acquisition time determines the lower limit of frequency $f(x;R)$. Short acquisition times with high resolution lead one to choose high values for $f(x;R)$:

| system | resolution r | acquisition time T | f(x;R) |
|---|---|---|---|
| frequency meter | | | $f_x > 10$ MHz |
| wave length meter | $10^{-6}$ | 0,1 sec | $f_R > 10$ MHz |
| beat | | | $f_x \approx f_R > 10$ MHz |

Measuring by frequency meter imposes limits for the frequency to be measured. If the latter is inferior to the limit it must undergo multiplication to bring it to the desired level. Frequency multiplying circuits are critical in their application and generally include frequency selecting filters.

Measurement by wave length meter imposes a limit for the reference frequency which does not bring about major difficulties so long as one has available adequate generators.

Measurement by beat does not enable one to obtain directly the sign of the difference relative to the limiting value.

The invention proposes a system permitting comparison of two frequencies in magnitude and in sign, one of these frequencies acting as a limit provided with a high resolving power as well as a short acquisition time and delivers the information in an analog form.

It achieves this purpose by an electronic arrangement which determines the phase difference between two frequencies, which differentiated, is representative in magnitude and in sign of the difference between the two frequencies.

For better understanding of the following description reference will be made to the drawings of which FIG. 1a is a block diagramme showing the principles of the apparatus according to the invention;

FIGS. 1b, 1c and 1d illustrate signal forms at certain specific points of the diagramme preceding;

The system described and illustrated by FIG. 1a is based on the measurement of the speed of phase slippage between the frequency to be measured and the reference frequency.

A flip-flop (FF) 1 receives the reference frequency $f_R$ on its clock input, and short impulses produced once per period from the frequency to be measured $f_x$ on its clear input. The output A of flip-flop 1 will thus be the source of a pulse signal of which the cyclic relationship changes as a function of the phase difference existing between the two frequencies as shown in FIG. 1b. After clipping and transmission to a low pass filter 2 one obtains at 3 a voltage proportional to the phase difference. Should a frequency difference $\Delta f$ exist between the two frequencies at the input this voltage will have the form of a saw tooth of which the period will be $1/\Delta f$ and of which the slope will be proportional to the speed of the phase variation, thus to $\Delta f$ as in FIG. 1c.

The passage of this signal through a differentiating circuit 3 will furnish at the output C a voltage proportional to $\Delta f$ (FIG. 1d).

The acquisition time is very short. It is determined by the band width of the low pass filter 2 and as well as the band width of the differentiating circuit 3 which must be limited in order to assure stability.

Although the resolution of an analog system cannot be defined in an absolute manner it may be admitted in order to simplify matters as the equivalent of 10% of the maximum peak of the output circuit. From this point, taking into account the limits of the band width mentioned above, the relationship which ties the minimum frequency to be measured f to the acquisition time T and to the resolution r may for circuits designed according to usual techniques approximately be represented by:

$$f_{(x;R)} \geq \frac{1}{8\sqrt{r} \cdot T}$$

Relative to traditional counting arrangements for equal frequencies and for resolutions going from $10^{-5}$ to $10^{-6}$ the time of acquisition is reduced by a factor between 1,000 and 10,000.

Practically, this system can not be applied just as shown since after each phase variation of 360° the saw tooth passes through a maximum transition which produces a pulse of great amplitude at the differentiating output thereby annulling the average value of the output voltage (FIG. 1d).

Figure 2:
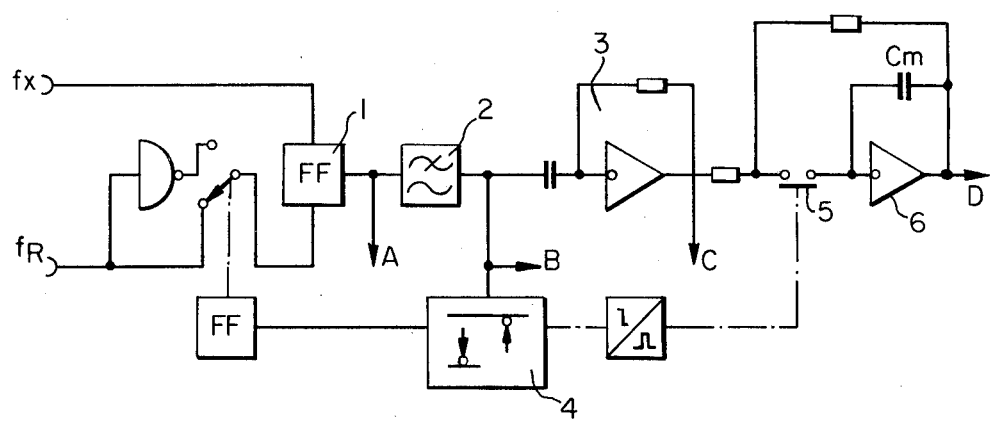
FIG. 2a-2d shows the diagramme of an apparatus according to the invention as well as forms of different signals relating thereto.
Figure 2:
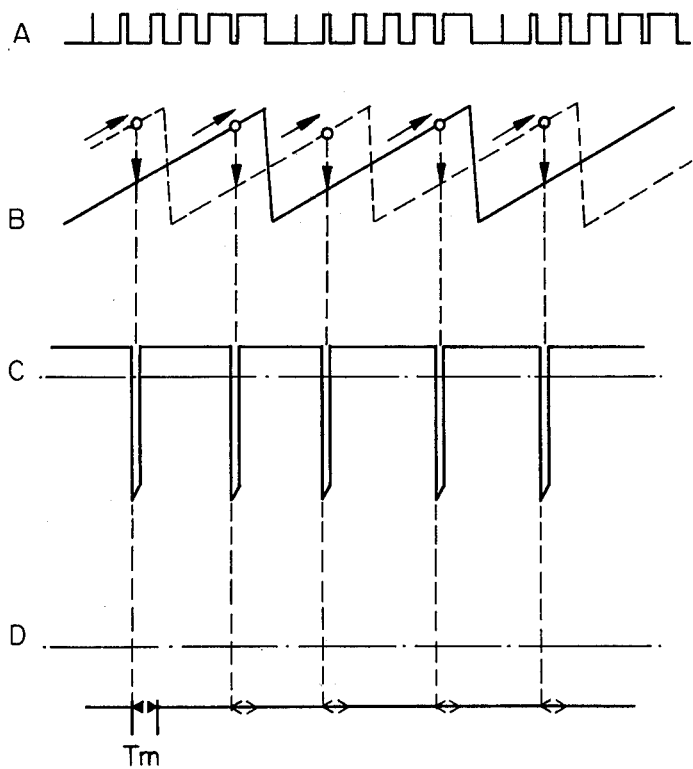

This invention proposes two solutions:

In the first as shown in FIG. 2 a threshold detector 4 controls the voltage proportional to the phase difference and furnishes a signal when the latter goes beyond a given chosen value between 270° and 360°. The frequency difference may be either positive or negative and the threshold circuit will react as well for an excess in the positive direction as in the negative direction. The signal operates a switch 5 comprising a flip-flop and gates which will take as reference the inverse of the input signal, thus a signal 180° apart. At the same time an output amplifier 6 provided with a capacitive memory $C_m$ is briefly disconnected. The memory will keep its information during a time $T_m$.

This arrangement provides the following advantages:

elimination of the high amplitude pulse translating the passage of the phase from 360° et 0°, passage from 300° to 300° ± 180° or any other suitable value occurs without ambiguity since it is decided by the threshold detector 4. One may thus freely arrange the sequence of phase change and the inhibition of the output circuit.

Figure 3:
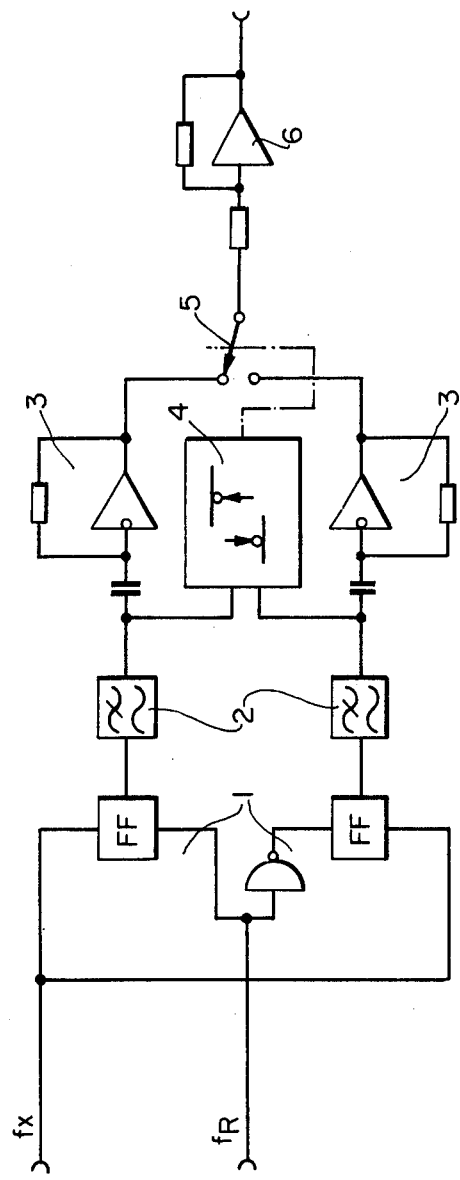
FIG. 3 shows the preferred form of the invention.

In the second arrangement as shown in FIG. 3 one may correct the fact that the process described hereinabove operates badly if $\Delta f$ becomes too great, the time of inhibition being no longer negligible in view of the duration of $1/\Delta f$. One prefers then a divided chain from the input of the two frequencies $f_x; f_R$ up until the differentiated output. Switching is made at this level in an extremely short time period thus avoiding dead times. One may thus measure frequencies greatly different even if they are subject to rapid fluctuations.

What we claim is:

1. Electronic apparatus for comparing in magnitude and sign the frequency of first a signal of unknown frequency to a second signal having a reference frequency, said apparatus comprising:
   a two input flip-flop, each input receiving one of said first and second signals to be compared, the output of the flip-flop being a signal of which the cyclic relation varies proportionally to the phase difference between said first and second signals in the interval of their period;
   a low pass filter having a cut-off frequency below the frequency of said first and second signals, said filter being coupled to the output of said flip-flop and producing at its output a signal having an amplitude proportional to the phase difference between said first and second signals;
   a differentiating circuit coupled to the output of said low pass filter, said differentiating circuit producing at its output a differentiated signal having an amplitude proportional to the variation of the phase difference between said first and second signals relative to time and representing in magnitude and in sign the difference in frequency between the two compared frequencies; and,
   an output circuit switchably connected to said differentiating circuit and responsive to said differentiated signal, said output circuit including means for storing the last value of said differentiated signal received from said differentiating circuit if said output circuit should be disconnected therefrom; and,
   switching circuit means connected to said filter and responsive to said filter output signal for disconnecting said output circuit from said differentiator circuit and switching by 180° the phase of one of said first and second signals when the value of said filter output signal represents a predetermined phase difference between said first and second signals.

2. Electronic apparatus for comparing in magnitude and sign a first signal of unknown frequency to a second signal having a reference frequency said apparatus comprising:
   first and second chains;
   first mean for applying one of said first and second signals to both said chains;
   second means for applying the other of said first and second signals to one of said chains directly and to the other of said chains with a 180° phase reversal;
   each of said first and second chains including:
      a flip-flop having two inputs for receiving said first and second signals and an output for producing a signal the cyclic relation of which varies in proportion to the phase difference between said first and second signals in the interval of their period,
      a low pass filter having a cut-off frequency below the frequency of said first and second signals, said filter being coupled to the output of said flip-flop and producing at its output a signal having an amplitude proportional to the phase difference between said first and second signals, and,
      a differentiating circuit coupled to the output of said low pass filter, said differentiating circuit producing at its output a differentiated signal having an amplitude proportional to the variation of the phase difference between said first and second signals relative to time and representing in magnitude and in sign the difference in frequency between the two compared frequencies;
   an output circuit switchably connectable to the differentiating circuit of both said chains; and,
   switching circuit means connected to the filter in each of said chains and responsive said filter output signals for switching said output circuit from one of said differentiating circuits to the other when the value of a filter output signal represents a predetermined phase difference between said first and second signals.

* * * * *